(12) United States Patent
Uchida et al.

(10) Patent No.: US 8,237,172 B2
(45) Date of Patent: Aug. 7, 2012

(54) SEMICONDUCTOR DEVICE HAVING A SILICON CARBIDE SUBSTRATE WITH AN OHMIC ELECTRODE LAYER IN WHICH A REACTION LAYER IS ARRANGED IN CONTACT WITH THE SILICON CARBIDE SUBSTRATE

(75) Inventors: Masao Uchida, Hyogo (JP); Kazuya Utsunomiya, Osaka (JP); Masashi Hayashi, Osaka (JP)

(73) Assignee: Panasonic Corporation, Osaka (JP)

( * ) Notice: Subject to any disclaimer, the term of this patent is extended or adjusted under 35 U.S.C. 154(b) by 323 days.

(21) Appl. No.: 12/676,415

(22) PCT Filed: Oct. 24, 2008

(86) PCT No.: PCT/JP2008/003019
§ 371 (c)(1),
(2), (4) Date: Mar. 4, 2010

(87) PCT Pub. No.: WO2009/054140
PCT Pub. Date: Apr. 30, 2009

(65) Prior Publication Data
US 2010/0207125 A1    Aug. 19, 2010

(30) Foreign Application Priority Data

Oct. 24, 2007 (JP) .................. 2007-276209
Aug. 7, 2008 (JP) .................. 2008-203970

(51) Int. Cl.
*H01L 31/0312* (2006.01)
*H01L 21/28* (2006.01)
(52) U.S. Cl. .......... 257/77; 257/288; 257/763; 438/582; 438/685

(58) Field of Classification Search .......... None
See application file for complete search history.

(56) References Cited

U.S. PATENT DOCUMENTS

| 7,294,858 | B2 * | 11/2007 | Okamura et al. ............. 257/77 |
| 2003/0080384 | A1 | 5/2003 | Takahashi et al. |
| 2003/0107041 | A1 | 6/2003 | Tanimoto et al. |
| 2003/0183895 | A1 | 10/2003 | Okamura et al. |

(Continued)

FOREIGN PATENT DOCUMENTS

JP        01-268121        10/1989
(Continued)

OTHER PUBLICATIONS

International Search Report for corresponding application No. PCT/JP2008/003019 dated Dec. 16, 2008.

(Continued)

*Primary Examiner* — Alonzo Chambliss
(74) *Attorney, Agent, or Firm* — Renner, Otto, Boisselle & Sklar, LLP

(57) ABSTRACT

A semiconductor device according to the present invention includes: a silicon carbide substrate (11) that has a principal surface and a back surface; a semiconductor layer (12), which has been formed on the principal surface of the silicon carbide substrate; and a back surface ohmic electrode layer (1*d*), which has been formed on the back surface of the silicon carbide substrate. The back surface ohmic electrode layer (1*d*) includes: a reaction layer (1*da*), which is located closer to the back surface of the silicon carbide substrate and which includes titanium, silicon and carbon; and a titanium nitride layer (1*db*), which is located more distant from the back surface of the silicon carbide substrate.

10 Claims, 9 Drawing Sheets

U.S. PATENT DOCUMENTS

| | | |
|---|---|---|
| 2005/0104134 A1 | 5/2005 | Kato |
| 2006/0273323 A1 | 12/2006 | Yamamoto et al. |

FOREIGN PATENT DOCUMENTS

| | | |
|---|---|---|
| JP | 08-064800 | 3/1996 |
| JP | 09-283738 | 10/1997 |
| JP | 2002-075908 | 3/2002 |
| JP | 2002-093742 | 3/2002 |
| JP | 2002-170784 | 6/2002 |
| JP | 2003-243654 | 8/2003 |
| JP | 2004-519842 | 7/2004 |
| JP | 2004-221513 | 8/2004 |
| JP | 2005-109346 | 4/2005 |
| JP | 2005-260028 | 9/2005 |
| JP | 2005-277240 | 10/2005 |
| JP | 2006-032458 | 2/2006 |
| JP | 2006-066438 | 3/2006 |
| JP | 2006-324585 | 11/2006 |
| JP | 2006-344688 | 12/2006 |
| JP | 2007-157751 | 6/2007 |
| JP | 2007201155 A * | 8/2007 |
| WO | 02/29900 A2 | 4/2002 |

OTHER PUBLICATIONS

Okojie et al., "Electrical Characterization of Annealed Ti/TiN/Pt Contacts on N-Type 6H-SiC Epilayer", IEEE Transactions on Electron Devices, Feb. 1999, Vo. 46, No. 2, pp. 269-274.

Office Action for corresponding Japanese application No. JP 2009-537941 dated Feb. 9, 2010 including English translation.

Saichiro Kaneko et al., "Formation of Ohmic Alloy Contact on Backside of 4H-SiC Substrate", Proceedings of the 60$^{th}$ General Conference of the Japan Society of Applied Physics, Autumn, 1999, vol. 1, published in Sep. 1999 by the Japan Society of Applied Physics, p. 337 (3p-R-6).

Japanese Notice of Reasons for Rejection for corresponding Japanese Application No. 2009-537941 mailed May 18, 2010 and English translation.

\* cited by examiner (a)

(b)

(c)

(a)

(b)

(c)

(d)

(e)

(f)

SEMICONDUCTOR DEVICE HAVING A SILICON CARBIDE SUBSTRATE WITH AN OHMIC ELECTRODE LAYER IN WHICH A REACTION LAYER IS ARRANGED IN CONTACT WITH THE SILICON CARBIDE SUBSTRATE

TECHNICAL FIELD

The present invention relates to a semiconductor device with a silicon carbide substrate and a method for fabricating such a device.

BACKGROUND ART

Silicon carbide (SiC) is a high-hardness semiconductor material with a greater bandgap than silicon (Si), and has been used extensively in various types of semiconductor devices including power elements, hostile-environment elements, high temperature operating elements, and radio frequency elements. Among other things, the application of SiC to power elements such as switching elements and rectifiers has attracted a lot of attention. This is because a power element that uses SiC can significantly reduce the power loss compared to a Si power element.

Among various power elements that use SiC, switching elements such as a MOSFET and a MESFET are known as typical ones. Such a switching element can switch between ON state in which drain current of several amperes (A) or more flows and OFF state in which the drain current becomes zero by changing the voltages applied to its gate electrode. Also, in the OFF state, SiC will achieve as high a breakdown voltage as several hundred volts or more. As for rectifiers, a Schottky diode, a pn diode and other SiC rectifiers have already been reported and are all expected to be rectifiers that can operate with a huge amount of current and with a high breakdown voltage.

Many of those power elements adopt a structure in which current flows perpendicularly to the principal surface of the substrate (which will be referred to herein as a "vertical direction"). In this description, one side of a silicon carbide substrate on which major structures of the element are to be formed will be referred to herein as the "principal surface", and the other side of the substrate, opposite to the principal surface, will be referred to herein as a "back surface". Such an element is sometimes called a "vertical element". In most vertical elements, an electrode that has been patterned using photoresist will be arranged on their principal surface, while their back surface will be almost entirely covered with an ohmic electrode.

A vertical switching element that uses SiC is disclosed in Patent Document No. 1, for example. Hereinafter, the structure of a vertical MOSFET will be described with reference to the accompanying drawings.

FIG. 11 is a schematic cross-sectional view illustrating a unit cell 1000 of a vertical MOSFET that uses SiC. It should be noted that a vertical MOSFET typically has a plurality of unit cells.

The unit cell 1000 of the vertical MOSFET includes a silicon carbide epitaxial layer 120 that has been formed on the principal surface of an n-type SiC substrate 101 with low resistivity, a channel layer 106 that has been formed on the silicon carbide epitaxial layer 120, a gate electrode 108 that is arranged over the channel layer 106 with a gate insulating film 107 interposed between them, a source electrode 109 that contacts with the surface 120s of the silicon carbide epitaxial layer, and a drain electrode 110 arranged on the back surface of the SiC substrate 101.

The silicon carbide epitaxial layer 120 has a well region 103, of which the conductivity type (i.e., p-type in this example) is different from that of the SiC substrate 101, and a drift region 102, which is the rest of the silicon carbide epitaxial layer 120 other than the well region 103. More specifically, the drift region 102 is an $n^-$-type silicon carbide layer including an n-type dopant, of which the concentration is lower than in the SiC substrate 101. Inside the well region 103, defined are an n-type heavily doped source region 104 including an n-type dopant and a $p^+$-type contact region 105 that includes a p-type dopant at a higher concentration than the well region 103. The well region 103, the source region 104 and the contact region 105 are defined by performing the process step of implanting dopants into the silicon carbide epitaxial layer 120 and a high-temperature heat treatment process step (i.e., activating annealing process step) that activates the dopants that have been introduced into the silicon carbide epitaxial layer 120.

The source region 104 and the drift region 102 are connected together through the channel layer 106, which may be a 4H—SiC layer that has been formed on the silicon carbide epitaxial layer 102 by epitaxy process, for example. Also, the contact region 105 and the source region 104 make ohmic contact with the source electrode 109. Consequently, the well region 103 is electrically connected to the source electrode 109 via the contact region 105.

The source electrode 109 can be formed by depositing a conductive material such as Ni on the source region 104 and the contact region 105 of the silicon carbide epitaxial layer 120 and then annealing the material at a high temperature. Normally, the source electrode 109 is obtained by performing a post deposition annealing process at as high a temperature as about 1,000° C. According to this method, a reaction layer is formed in the interface between the conductive material layer and the source region 104 and between the conductive material layer and the contact region 105 as a result of the high-temperature annealing process. For that reason, the source electrode 109 thus obtained will have good ohmic property with respect to these regions 104 and 105. More specifically, if the material of the source electrode is Ni, then Ni would react to Si in the silicon carbide layer to produce Ni silicide. Meanwhile, C in silicon carbide would be introduced into the Ni silicide film and an impurity level would be produced by C in the interface between Ni silicide and silicon carbide to form an ohmic junction there.

The gate insulating film 107 may be a thermal oxide film (i.e., $SiO_2$ film) that has been formed by heating and oxidizing the surface of the channel layer 106, for example. The gate electrode 108 may be made of electrically conductive polysilicon, for example.

The gate electrode 108 is covered with an interlevel dielectric film 111 with a hole 120s. Through this hole 120s, the source electrode 109 of each unit cell is connected in parallel to an upper electrode layer (e.g., an Al electrode) 112

The drain electrode 110 is also required to have ohmic properties. That is why Ni is also used as a material for the drain electrode 110. Specifically, the drain electrode 110 is obtained by depositing Ni on the back surface of the silicon carbide substrate 101 and then annealing it at as high a temperature as about 1,000° C. A reverse electrode 130 is further formed for assembly purposes on the surface of the drain electrode (corresponding to the lower surface of the drain electrode shown in FIG. 11). In most cases, the reverse electrode 130 is a multilayer electrode consisting of Ti, Ni and Ag layers, for example, which are stacked one upon the other so that Ti contacts with the drain electrode 110.

The ends of the upper electrode layer 112 on the principal surface are covered with a passivation layer (not shown) made mostly of SiN, thereby minimizing breakdown of the device due to creeping discharge on the principal surface. That passivation layer is deposited over the entire surface of the upper electrode layer and excessive portions thereof are etched away. The drain electrode 110 on the back surface needs to be protected while an etching process is carried out on the principal surface. For example, the drain electrode 110 could be protected by depositing photoresist over the reverse ohmic electrode 110, performing patterning on the principal surface of the device, removing the photoresist from the back surface, and then forming the back surface electrode as disclosed in Patent Document No. 2.

Patent Document No. 1: Japanese Patent Application Laid-Open Publication No. 2004-519842

Patent Document No. 2: Japanese Patent Application Laid-Open Publication No. 2003-243654

DISCLOSURE OF INVENTION

Problems to be Solved by the Invention

In most cases, an SiC substrate for use to make a vertical MOSFET will have only its principal surface mirror-polished, and will have a back surface that has a greater surface roughness than its principal surface. Also, particularly when an SiC (0001) substrate (which may have an off-axis angle of several degrees) is used, the principal surface will be an Si plane and the back surface will be a C plane.

Generally speaking, the higher the degree of surface roughness of the principal surface of a substrate, the more easily the surface will get oxidized. Also, C will get oxidized more easily than Si. That is why as for an SiC substrate for use to make a vertical MOSFET, its back surface will get oxidized more easily, and will allow an oxide film to grow faster thereon, than its principal surface.

Also, in fabricating a vertical element such as the MOSFET shown in FIG. 11, the process step of thermally oxidizing either the principal surface of the SiC substrate or the surface of an SiC semiconductor layer that covers the principal surface and then partially removing the thermal oxide film that has grown thereon is often performed. During that process step, a thermal oxide film will be formed on the back surface of the SiC substrate, too. If the back surface is oxidizable more easily than the principal surface as described above, the thermal oxide film will grow thicker on the back surface than on the principal surface. In that case, if the etching process were performed under such a condition as to remove the thermal oxide film from the principal surface completely, part of the thermal oxide film could be left on the back surface. In that case, the ohmic property in the interface between the drain electrode 110 on the back surface and the SiC substrate 101 could be affected.

On top of that, during the heat treatment process in which an ohmic electrode is formed on the back surface of the SiC substrate, Ni will form a silicide easily, and therefore, silicidation reaction will occur almost over the entire surface of Ni. However, as Ni does not form a reaction layer with carbon so easily, carbon (C), which has come from SiC, will precipitate on the uppermost surface of the Ni silicide on the back surface of the SiC substrate (i.e., the surface of the Ni silicide that is not in contact with the back surface of the SiC substrate). It is difficult to remove that carbon by a normal type of pre-processing (i.e., a kind of wet processing using an acid), which is often adopted in an electrode depositing process step. That is why if the reverse electrode 130 is formed on the ohmic electrode that is made of the Ni silicide on the back surface of the SiC substrate, then the degree of close contact will decrease in their interface. With such a decreased degree of close contact, while the device is assembled into a package, the electrode will peel off during the die bonding process, thus eventually causing a decrease in production yield.

Also, while an etching or any other patterning process step is carried out to form the device structure on the principal surface, the drain electrode 110 on the back surface needs to be protected. The drain electrode on the back surface is normally protected by depositing photoresist on the ohmic electrode 110. Thereafter, the semiconductor layers and electrodes on the principal surface of the SiC substrate are patterned with a mask of silicon nitride, for example, made on the principal surface of the device. In this case, if the masking pattern is defined by dry etching, then the photoresist on the back surface could get cured under plasma or heat and get difficult to remove after the dry etching process. Then, the photoresist would be left between the reverse electrode 130 and the drain electrode 110 on the back surface, thus deteriorating the electrical characteristic eventually. Or as the case may be, the photoresist could be lost entirely as a result of the dry etching process. In that case, the drain electrode 110 on the back surface would be exposed to the dry etching gas directly, the reverse ohmic electrode 110 would get damaged (i.e., discolored or altered) and the electrical characteristic would deteriorate eventually.

It is therefore an object of the present invention to avoid such a decrease in the degree of close contact and electrode peeling in a semiconductor device including an ohmic electrode that has been formed on the back surface of a silicon carbide substrate.

Means for Solving the Problems

A semiconductor device according to the present invention includes: a silicon carbide substrate that has a principal surface and a back surface; a silicon carbide layer, which has been formed on the principal surface of the silicon carbide substrate; and an ohmic electrode layer, which has been formed on the back surface of the silicon carbide substrate. The ohmic electrode layer includes: a reaction layer, which is located closer to the back surface of the silicon carbide substrate and which includes titanium, silicon and carbon; and a titanium nitride layer, which is located more distant from the back surface of the silicon carbide substrate.

In one preferred embodiment, the semiconductor device further includes: an insulating layer, which partially covers the semiconductor layer either directly or indirectly; and a protective layer, which has been formed on the surface of the titanium nitride layer of the ohmic electrode layer. The protective layer has resistance to an etching process being performed on the insulating layer.

In this particular preferred embodiment, the semiconductor device further includes a metallic electrode layer, which is arranged on the surface of the protective layer, and the protective layer has electrical conductivity.

In another preferred embodiment, the semiconductor device further includes a metallic electrode layer, which has been formed on the surface of the titanium nitride layer of the ohmic electrode layer.

In still another preferred embodiment, the concentration of carbon in the ohmic electrode layer is higher in its region closer to the silicon carbide substrate than in its region more distant from the back surface of the silicon carbide substrate.

In yet another preferred embodiment, the silicon carbide layer has n-type conduction.

In this particular preferred embodiment, the semiconductor device further includes: a p-type well region, which is defined in the silicon carbide layer; an n$^+$-type source region and a p$^+$-type contact region, which form respective parts of the p-type well region; a channel region, which is electrically connected to the n$^+$-type source region and to the rest of the silicon carbide layer other than the p-type well region; a source electrode, which is electrically connected to the n$^+$-type source region and the p$^+$-type contact region; a gate insulating film, which is arranged on the channel region; and a gate electrode, which is arranged on the gate insulating film. The ohmic electrode layer functions as a drain electrode.

In yet another preferred embodiment, the semiconductor device further includes a Schottky electrode that makes Schottky contact with the semiconductor layer.

A method for fabricating a semiconductor device according to the present invention includes the steps of: (A) providing a silicon carbide substrate, the principal surface of which is already covered with a semiconductor layer; (B) forming an electrode layer, including titanium, on the back surface of the silicon carbide substrate; (C) conducting a heat treatment on the silicon carbide substrate and producing a reaction between the electrode layer and the silicon carbide substrate, thereby forming a reaction layer, including titanium, silicon and carbon, on the back surface of the silicon carbide substrate; and (D) forming a titanium nitride layer on the surface of the reaction layer.

In one preferred embodiment, the steps (C) and (D) are performed simultaneously by conducting the heat treatment in the step (C) within an atmosphere including nitrogen.

In this particular preferred embodiment, the method for fabricating a semiconductor device further includes the steps of: (E) forming an insulating layer, which partially covers the semiconductor layer either directly or indirectly, after the step (D) has been performed; (F) forming a protective layer on the ohmic electrode layer; and (G) etching the insulating layer after the step (F) has been performed.

In a specific preferred embodiment, the method for fabricating a semiconductor device further includes the step (H) of removing the protective layer after the step (G) has been performed.

Effects of the Invention

According to the present invention, the back surface ohmic electrode layer has a reaction layer including titanium, silicon and carbon. That is why even if an oxide film or any other residue were slightly left on the back surface of the silicon carbide substrate, that oxide film would be reduced by titanium and a reaction to be produced between titanium and silicon carbide would form a good ohmic contact with little contact resistance. This method is particularly effective when an ohmic contact needs to be formed on a silicon carbide substrate, of which the back surface is a C-plane, because an oxide film can be formed easily on the C-plane.

In addition, as the surface of the ohmic electrode layer is a titanium nitride layer, the ohmic electrode is not etched easily when the electrode on the principal surface of the silicon carbide substrate is patterned. On top of that, if a back surface protective layer is further provided on the ohmic electrode layer, it is possible to prevent the ohmic electrode layer from getting damaged or etched unintentionally while an insulating layer on the principal surface is being etched.

DESCRIPTION OF REFERENCE NUMERALS

Figure 1:
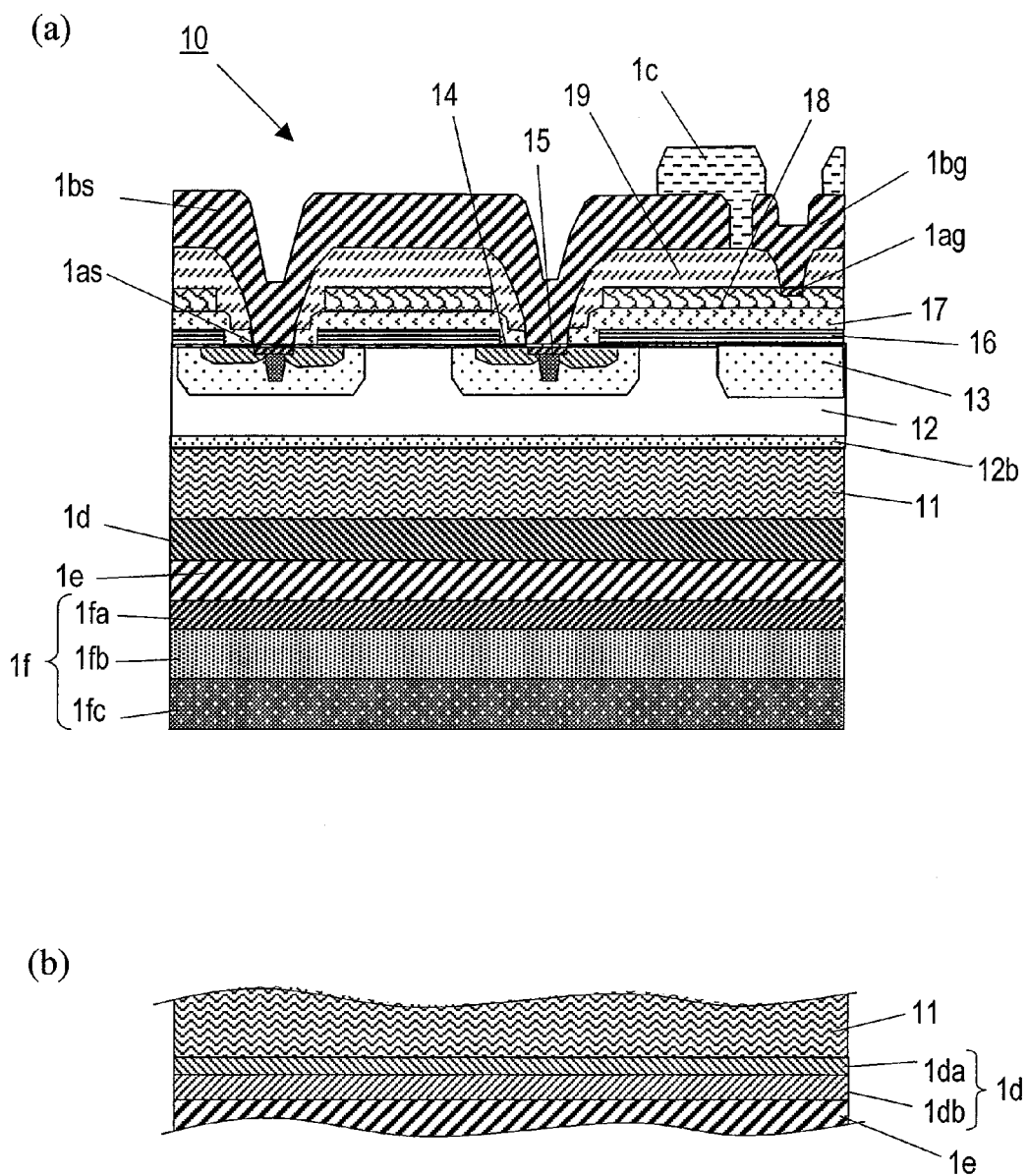
FIG. 1(*a*) is a cross-sectional view illustrating a first preferred embodiment of a semiconductor device according to the present invention and FIG. 1(*b*) is a cross-sectional view illustrating an ohmic electrode layer and its surrounding region on a larger scale.

1*as* source electrode
1*ag* electrode that makes ohmic contact with gate electrode
1*bs* upper interconnect electrode
18
1*bg* gate pad electrode
1*c* passivation layer
1*d* back surface ohmic electrode layer
1*da* reaction layer
1*db* titanium nitride layer
1*e* back surface protective layer
1*f* metallic electrode layer
6*a* Schottky electrode layer
6*b* upper interconnect electrode layer
6*c* passivation layer
10, 10*a* semiconductor device (MOSFET)
11 silicon carbide substrate
12 semiconductor layer
13 p-type well region
14 n$^+$-type source region
15 p$^+$-type contact region
16 channel layer
17 gate insulating film
18 gate electrode
19 interlevel dielectric film
60, 60*a* semiconductor device (Schottky diode)
63 girdling region
69 insulating layer

BEST MODE FOR CARRYING OUT THE INVENTION

Embodiment 1

Hereinafter, a first specific preferred embodiment of a semiconductor device according to the present invention will be described. In the following description of the first preferred embodiment, the semiconductor device is supposed to be a vertical MOSFET as an example. FIG. 1(a) illustrates a MOSFET 10 including a silicon carbide substrate 11, of which the principal surface defines a tilt angle of θ degrees (where $0 \leq \theta \leq 10$ degrees) with respect to a 4H—SiC (0001) plane in the <11-20> direction. The principal surface of the silicon carbide substrate 11 is a Si surface, while its back surface is a C-plane. The surface roughness of the principal surface is less than that of the back surface. The silicon carbide substrate 11 has a dopant concentration of $1 \times 10^{18}$ cm$^{-3}$ or more. A semiconductor layer 12 of n-type 4H—SiC (with a dopant concentration of approximately $1 \times 10^{14}$ to $1 \times 10^{17}$ cm$^{-3}$ and a thickness of 5 μm or more) has been epitaxially grown on the principal surface of the silicon carbide substrate 11. Optionally, a buffer layer 12b of 4H—SiC (which has a higher dopant concentration and a smaller thickness than the semiconductor layer 12) could be inserted between the semiconductor layer 12 and the silicon carbide substrate 11.

A p-type well region 13 doped with aluminum is defined in the semiconductor layer 12 and may have a depth of approximately 600 nm and an average concentration of approximately $1 \times 10^{18}$ cm$^{-3}$, for example. An n$^+$-type source region 14 is defined in the p-type well region 13 by implanting nitrogen into the p-type well region 13 of the silicon carbide substrate 11, for example. The n$^+$-type source region 14 may have a depth of approximately 300 nm and an average concentration of approximately $1 \times 10^{19}$ cm$^{-3}$. A p$^+$-type contact region 15 is defined in the p-type well region 13 and has a depth of approximately 400 nm and an average concentration of approximately $5 \times 10^{19}$ cm$^{-3}$.

A channel layer 16 of n-type silicon carbide is arranged on the surface of the semiconductor layer 12, and has a thickness of approximately 200 nm and an average concentration of approximately $1 \times 10^{17}$ cm$^{-3}$, for example. The channel layer 16 is doped mainly with nitrogen. The n-type channel layer 16 defines a channel region and electrically connects together the n$^+$-type source region 14 and the rest of the semiconductor layer 12 other than the p-type well region 13. When a gate voltage is applied to this MOSFET, a channel that lets electrons as carriers move through is produced in the channel region. A gate insulating film 17 has been deposited on the channel layer 16 to a thickness of approximately 80 nm, for example.

A gate electrode 18 is arranged on the gate insulating film 17 and may be made of n$^+$-type polysilicon and have a thickness of approximately 500 nm, for example. An interlevel dielectric film 19 has been deposited so as to cover the gate electrode 18 and mainly in order to electrically insulate the gate electrode 18 from an upper interconnect electrode 1bs to be described later. The interlevel dielectric film 19 may have a thickness of approximately 1 μm.

A source electrode 1as is arranged in the vicinity of the surface of the semiconductor layer 12 and is electrically connected to the source region 14 by making ohmic contact with the source region 14 with low resistance. The source electrode 1as may be made of Ni silicide, for example, and preferably also makes ohmic contact with the contact region 15.

An electrode 1ag is electrically connected to the gate electrode 18 so as to make ohmic contact with the gate electrode 18. Just like the source electrode 1as, the electrode 1ag is also made of Ni silicide. However, the electrode 1ag and the source electrode 1as are not necessarily made of the same material. The source electrode 1as is connected to the upper interconnect electrode 1bs, which connects together the respective source electrodes 1as of the unit cells in parallel with each other. The upper interconnect electrode 1bs may be made of aluminum and may have a thickness of approximately 3 μm, for example. In addition, a gate pad electrode 1bg is arranged so as to contact with the electrode 1ag, too. The gate pad electrode 1bg may be made of the same material as the upper interconnect electrode 1bs, for example. A passivation layer 1c may be arranged between the upper interconnect electrode 1bs and the gate pad electrode 1bg.

On the back surface of the silicon carbide substrate 11, arranged is a back surface ohmic electrode layer 1d. FIG. 1(b) illustrates the structure of the back surface ohmic electrode layer 1d and its surrounding region on a larger scale. As shown in FIG. 1(b), the back surface ohmic electrode layer 1d consists of a reaction layer 1da and a titanium nitride layer 1db. Specifically, the reaction layer 1da is arranged on one side in contact with the back surface of the silicon carbide substrate 11 and includes titanium, silicon and carbon. On the other hand, the titanium nitride layer 1db is arranged on the other side opposite to the one side that contacts with the back surface of the silicon carbide substrate and on the surface of the reaction layer 1da and is made mostly of titanium nitride.

The titanium nitride layer 1db also includes carbon. But looking at the back surface ohmic electrode layer 1d as a whole, the concentration of carbon is higher in the region closer to the silicon carbide substrate 11 than in the region more distant from the back surface of the silicon carbide substrate 11 (i.e., closer to the back surface protective layer 1e). The thicknesses of the reaction layer 1da and the titanium nitride layer 1db are not particularly limited. Rather, the effect of the present invention can be achieved as long as the back surface ohmic electrode layer 1d includes these two layers that are stacked in the order described above.

On the other side of the back surface ohmic electrode layer 1d, which is opposite to the one side that contacts with the back surface of the silicon carbide substrate 11, arranged is a back surface protective layer 1e, which is resistant to an etching process being performed on a passivation layer 1c, for example. More specifically, if the back surface protective layer 1e is etched on the same condition as that of an etching process on the passivation layer 1c, the etch rate of the back surface protective layer 1e will be one-tenth or less as high as that of the passivation layer 1c. Also, the back surface protective layer 1e has electrical conductivity.

For example, if the passivation layer 1c is made of SiN, then the passivation layer 1c may be etched by performing a dry etching process using a fluorocarbon-based gas. In that case, the back surface protective layer 1e may be made of aluminum that will be etched at a sufficiently low rate when subjected to a dry etching process using a fluorocarbon-based gas.

On the other side of the back surface protective layer 1e, which is opposite to the one side that contacts with the back surface ohmic electrode layer 1d, arranged is a metallic electrode layer 1f. In the example illustrated in FIG. 1(a), the metallic electrode layer 1f consists of three layers. However, the metallic electrode layer 1f may also consist of a single layer or may include multiple layers. For example, the metallic electrode layer 1f may include a Ti layer 1fa, a Ni layer 1fb, and an Ag layer 1fc. In that case, the Ti layer 1fa contacts with the back surface protective layer 1e. If this MOSFET 10 needs to be housed in a package such as TO-220, then the MOSFET 10 should be soldered with the leadframe of the package. For that reason, it is preferred that the MOSFET 10 include the metallic electrode layer 1f.

Figure 2:
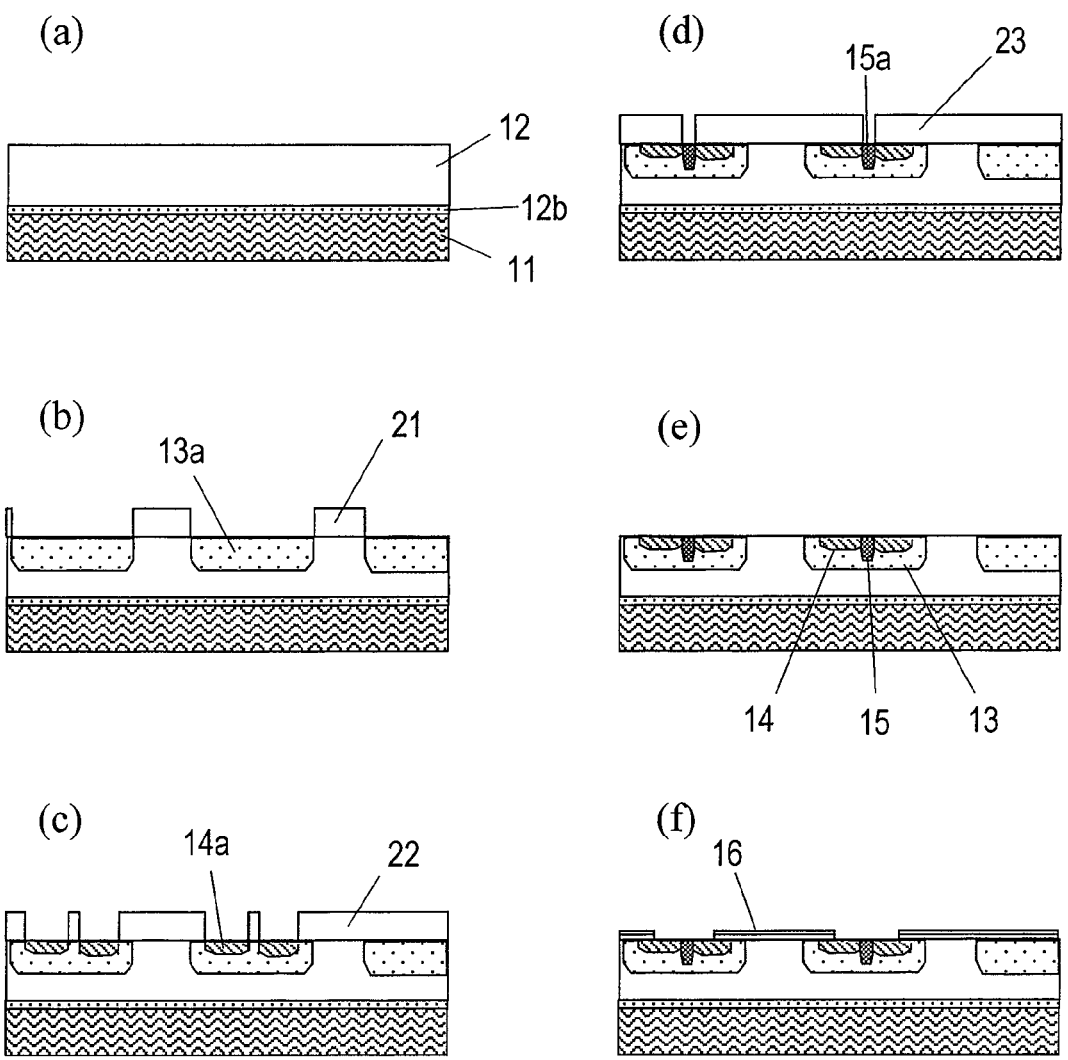
FIGS. 2(*a*) through 2(*f*) are cross-sectional views illustrating respective process steps to fabricate the semiconductor device shown in FIG. 1.
Figure 3:
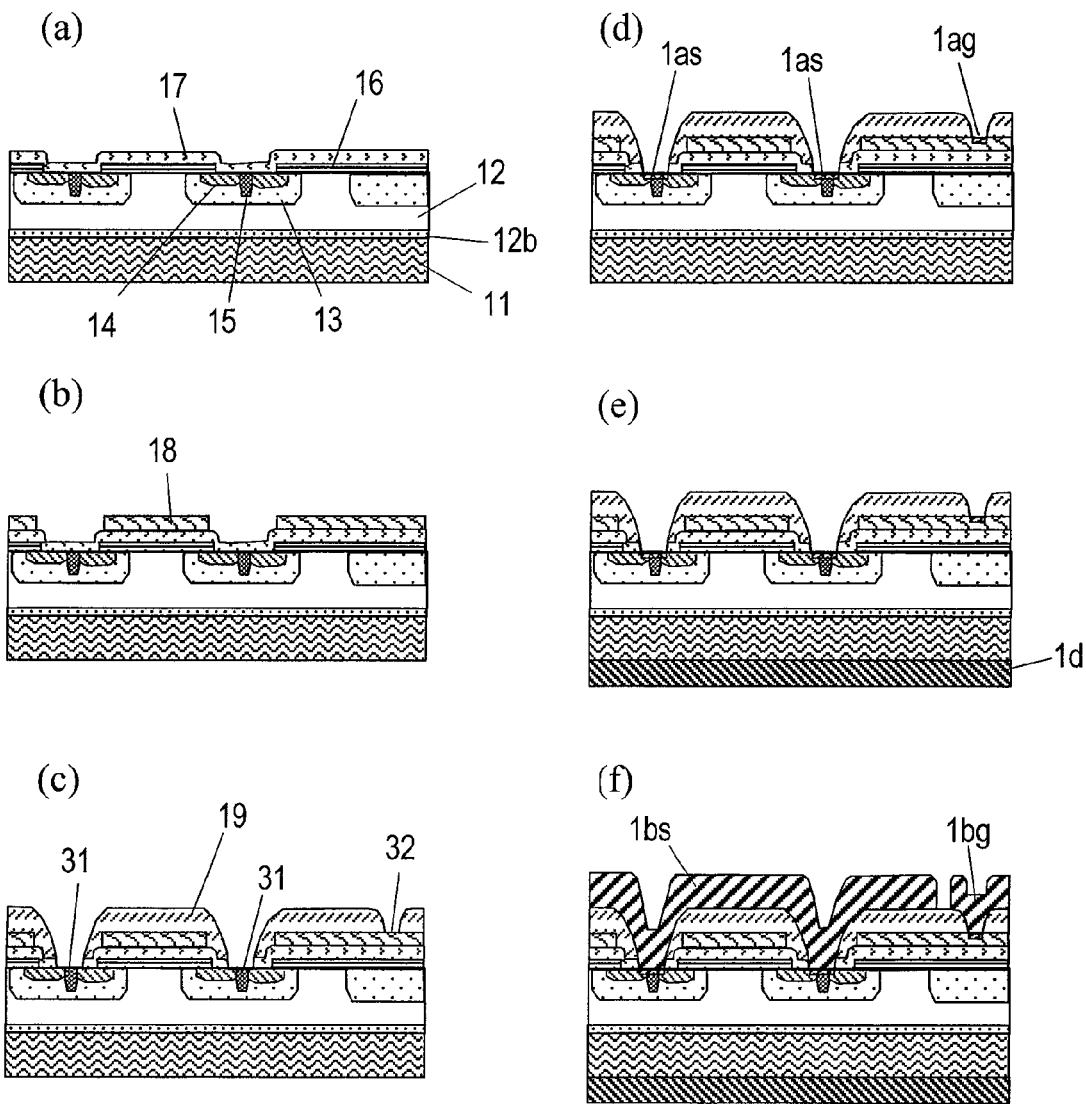
FIGS. 3(*a*) through 3(*f*) are cross-sectional views illustrating respective process steps to fabricate the semiconductor device shown in FIG. 1.
Figure 4:
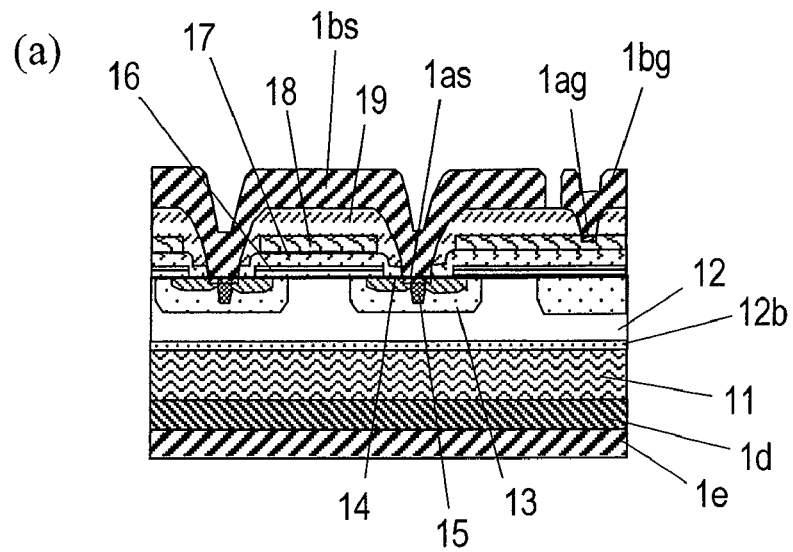
FIGS. 4(*a*) through 4(*c*) are cross-sectional views illustrating respective process steps to fabricate the semiconductor device shown in FIG. 1.
Figure 4:
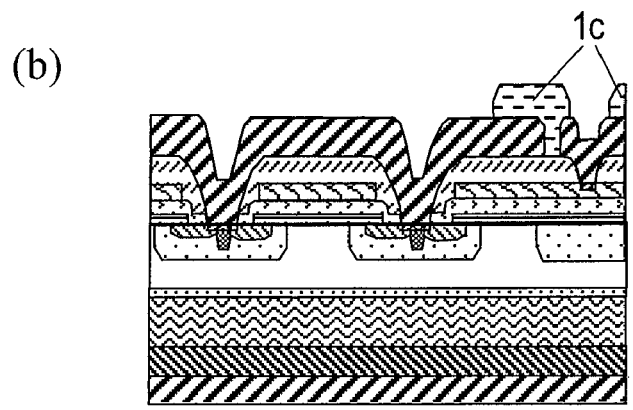
Figure 4:
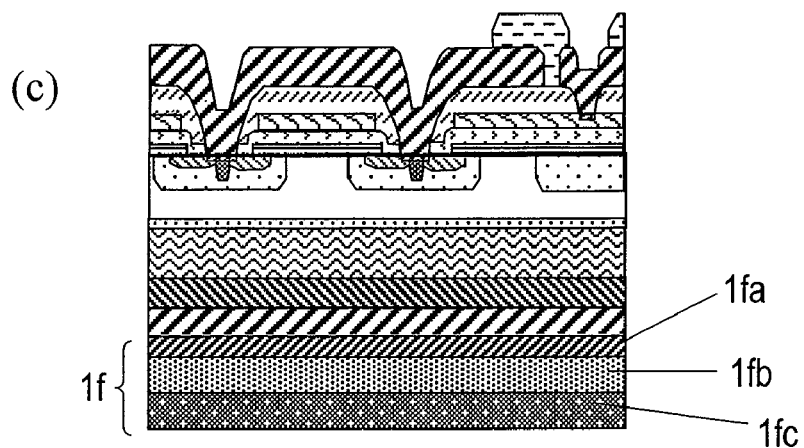

One of the characteristic features of the present invention is that the ohmic electrode layer 1d consists of the reaction layer 1da and the titanium nitride layer 1db. And this feature has something to do with the method for fabricating this semiconductor device 10. In other words, the effect to be achieved by providing the reaction layer 1da and the titanium nitride layer 1db is at least partially obtained while the semiconductor device 10 is being fabricated. That is why the features of the present invention will be described in further detail while the manufacturing process of the semiconductor device 10 is described with reference to FIGS. 2 to 4.

First, as shown in FIG. 2(a), a silicon carbide substrate 11, of which the principal surface has been covered with a semiconductor layer 12, is provided. In this example, the semiconductor layer 12 is made of 4H—SiC. Optionally, a buffer layer may be added to the interface between the semiconductor layer 12 and the principal surface of the silicon carbide substrate 11. In that case, the buffer layer is made of n$^+$-type silicon carbide, and has a thickness of approximately 0.5 to 4 μm and a dopant concentration of approximately $1\times10^{16}$ to $1\times10^{19}$ cm$^{-9}$.

Next, as shown in FIG. 2(b), after the surface of the semiconductor layer 12 is selectively covered with a mask 21, aluminum ions are implanted, thereby defining a p-type well region 13a. And the mask 21 is removed. Subsequently, as shown in FIG. 2(c), the semiconductor layer 12 is covered with another mask 22, and nitrogen ions are implanted, thereby defining an n$^+$-type source region 14a. And the mask 22 is removed. Thereafter, as shown in FIG. 2(d), the semiconductor layer 12 is covered with still another mask 23, and aluminum ions are implanted as dopant ions, thereby defining a p$^+$-type contact region 15a. And then the mask 23 is removed.

Next, a carbon-based thin film is deposited on the surface of the semiconductor layer 12 and then the substrate is heated to approximately 1,700° C. for about 30 minutes within an inert atmosphere, thereby activating the dopants introduced. Thereafter, the carbon-based thin film is removed to obtain a silicon carbide substrate 11 including the doped regions (i.e., the p-type well region 13, the n$^+$-type source region 14 and the p$^+$-type contact region 15) as shown in FIG. 2(e).

Subsequently, a channel layer 16 of silicon carbide is epitaxially grown on the semiconductor layer 12 that has those doped regions, and then selectively dry-etched so that the contact region 15 and the source region 14 are partially exposed, thereby obtaining the structure shown in FIG. 2(f).

Thereafter, as shown in FIG. 3(a), the semiconductor layer 12 with the channel layer 16 is heated to approximately 1,200° C. within an atmosphere including oxygen and oxidized, thereby forming a gate insulating film 17. Optionally, after this oxidation process gets done, the gate insulating film 17 may be subjected to a nitrification process by thermally treating the silicon carbide substrate within a gas including nitrogen atoms. Although the gate insulating film 17 is supposed to be formed by thermal oxidation process in this example, an insulating layer such as an SiO$_2$ layer could be deposited as the gate insulating film 17. Still alternatively, an insulating layer could also be deposited on a thermal oxide layer.

Next, a gate electrode 18 is formed on the gate insulating film 17. In this example, phosphine-doped n$^+$-type polysilicon is used as a material for the gate electrode 18 and patterned as shown in FIG. 3(b), thereby forming a gate electrode 18. Thereafter, an interlevel dielectric film 19 is further deposited over the structure shown in FIG. 3(b). Although the interlevel dielectric film 19 is an SiO$_2$ film including phosphorus (i.e., a PSG film) in this example, the interlevel dielectric film 19 could also be made of any other material.

Then, the interlevel dielectric film 19 is patterned and the gate insulating film 17 is also selectively etched as shown in FIG. 3(c), thereby partially exposing the contact region 15 and the source region 14 in the semiconductor layer 12. Thereafter, a metal (such as Ni) is deposited to a thickness of approximately 50-200 nm on at least a portion of their exposed surface (i.e., the exposed surface 31 shown in FIG. 3(c)) and then thermally treated at a temperature of approximately 800-1,100° C., thereby turning the interface between the metal deposited and the semiconductor layer 12 into a silicide and forming the source electrode 1as shown in FIG. 3(d). In this process step, an electrode 1ag that makes ohmic contact with the gate electrode 18 is also formed at the same time as shown in FIG. 3(d) on the exposed surface 32 shown in FIG. 3(c).

Next, an electrode layer including titanium is deposited on the back surface of the silicon carbide substrate 11 and then thermally treated at a temperature of approximately 800-1,100° C. within a nitrogen gas ambient, thereby forming a back surface ohmic electrode layer 1d as shown in FIG. 3(e).

During this heat treatment, a reaction is produced between the silicon carbide substrate 11 and the electrode layer including titanium. In this case, titanium will easily react to silicon to produce Ti silicide but may also react to carbon to produce Ti carbide. That is why as a result of the reaction between the silicon carbide substrate 11 and titanium, carbon will never liberate itself but the reaction layer 1da including titanium and silicon will start to be formed in a portion of the electrode layer that is closer to the silicon carbide substrate 11 as shown in FIG. 1(b). Also, as the heat treatment is carried out within a nitrogen gas ambient, a titanium nitride layer 1db will start to be formed in the rest of the electrode layer that is more distant from the back surface of the silicon carbide substrate 11 (i.e., on the surface of the reaction layer). In this case, while the reaction layer 1da is being produced, the titanium nitride layer 1db is also produced simultaneously on the surface of the electrode layer. That is why the titanium nitride layer 1db prevents carbon from diffusing toward the surface of the electrode layer while a reaction is being produced between the silicon carbide substrate 11 and titanium. As a result, a back surface ohmic electrode layer 1d, in which the carbon concentration is higher in a region closer to the back surface of the silicon carbide substrate 11 than in a region more distant from the silicon carbide substrate 11, is obtained.

Furthermore, Ti will get oxidized easily. That is why if an oxide film or any other residue is slightly left on the back surface of the silicon carbide substrate 11, then Ti in the electrode layer will reduce that oxide film first and foremost during the heat treatment process. As a result, the electrode layer including titanium can contact with the silicon carbide substrate 11 directly to promote the production of the reaction layer 1da described above. Consequently, a good ohmic property is realized.

Thereafter, as shown in FIG. 3(f), a metal (such as aluminum) to be an upper interconnect electrode is deposited over the principal surface (i.e., that side with the interlevel dielectric film 19), thereby forming an upper interconnect electrode 1bs and a gate pad electrode 1bg. If the upper interconnect electrode 1bs is made of aluminum and has been patterned by performing a wet etching process using a phosphoric acid based etchant, then the back surface ohmic electrode layer 1d on the back surface will be hardly etched because its surface is the titanium nitride layer.

If the patterning process is performed as a dry etching process, a metal such as Cu, Au or Pt is preferably deposited on the back surface ohmic electrode layer 1d to prevent the back surface ohmic electrode layer 1d from getting corroded.

In that case, that metal can be used as it is as the back surface protective layer 1e in a subsequent process step.

Next, as shown in FIG. 4(a), a back surface protective layer 1e is deposited on the back surface ohmic electrode layer 1d. The back surface protective layer 1e preferably has electrical conductivity and is made of aluminum in this example.

Since the back surface ohmic electrode layer 1d includes Ti and its surface is the titanium nitride layer 1db as described above, precipitation of carbon on the surface of the back surface ohmic electrode layer 1d can be reduced. As a result, the back surface protective layer 1e can make a good contact with the back surface ohmic electrode layer 1d and peeling of the back surface protective layer 1e off the back surface ohmic electrode layer 1d can be minimized.

Thereafter, as shown in FIG. 4(b), a passivation layer 1c is deposited over the principal surface of the silicon carbide substrate 11 (i.e., that side with the upper interconnect electrode (source pad) 1bs and the gate pad electrode 1bg) and then selectively etched so that those pads have their surface exposed with their periphery covered.

In this case, if an SiN film is used as the passivation layer 1c, then the passivation layer 1c is preferably dry-etched. As a silicon carbide substrate has a smaller diameter than a silicon substrate and as silicon carbide substrates with a diameter of three inches are currently used extensively, a barrel type dry etcher is particularly preferred to increase the throughput. With such a barrel type dry etcher, however, both the principal surface and the back surface of the silicon carbide substrate 11 would be exposed to plasma. For that reason, without the back surface protective layer 1e, the back surface ohmic electrode layer 1d would be directly exposed to plasma and could be partially etched according to the kind of the gas used.

The MOSFET 10 of this preferred embodiment includes the back surface protective layer 1e of aluminum. The back surface protective layer 1e is resistant to the dry etching process being performed on the passivation layer 1c on the principal surface, and therefore, can protect the back surface ohmic electrode layer 1d while the passivation layer 1c is being dry-etched. On top of that, the back surface protective layer 1e is hardly etched, either. As a result of this dry etching process, a structure that has the passivation layer 1c on its surface can be obtained as shown in FIG. 4(b).

If polyimide is used as a material for the passivation layer 1c, then the material of the back surface protective layer 1e may be selected from the group consisting of aluminum, Cu, Au, Ag and Pt.

Finally, the uppermost surface layer of the back surface protective layer 1e shown in FIG. 4(b) is slightly etched (e.g., wet-etched with diluted hydrofluoric acid) and a metallic electrode layer 1f is deposited on the back surface protective layer 1e to complete the MOSFET 10. As shown in FIG. 4(c), the metallic electrode layer 1f includes a Ti layer 1fa, an Ni layer 1fb and an Ag layer 1fc. However, the multilayer structure of the metallic electrode layer 1f does not have to be what is shown in FIG. 4(c) but could be appropriately determined by the package shape of the MOSFET 10. Specifically, the metallic electrode layer 1f may consist of either Ti/Ni/Au layers or Cr/NiCr/Ni/Ag layers or could be any other combination of metals.

In the preferred embodiment described above, the metallic electrode layer 1f is supposed to be deposited with the back surface protective layer 1e left almost as it is. However, the MOSFET of the present invention could have no back surface protective layer 1e, too. That is to say, the present invention could also be implemented as a MOSFET 10a with no back surface protective layer 1e as shown in FIG. 5.

Figure 5:
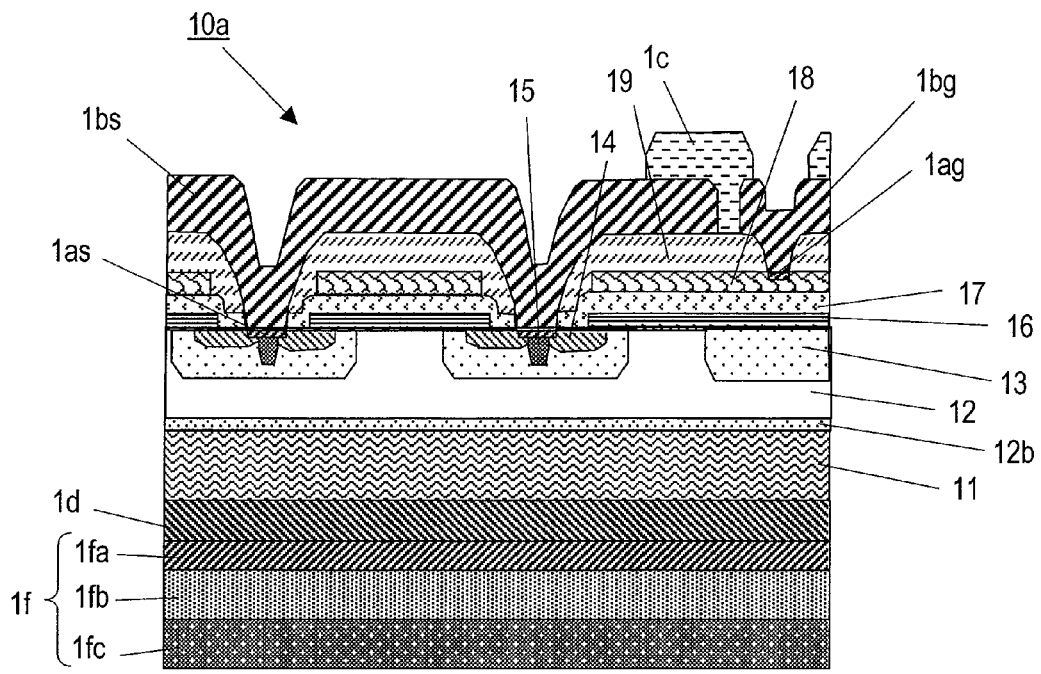
FIG. 5 is a cross-sectional view illustrating a modified example of the first preferred embodiment.

The MOSFET 10a shown in FIG. 5 has a structure which includes no back surface protective layer 1e and in which the metallic electrode layer 1f is arranged directly on the other side of the back surface ohmic electrode layer 1d that is opposite to its surface in contact with the back surface of the silicon carbide substrate 11.

Such an MOSFET 10a can be obtained by removing the back surface protective layer 1e while the MOSFET 10 described above is being fabricated. For example, during the manufacturing process of the MOSFET 10 described above, the passivation layer 1c shown in FIG. 4(b) may be etched and patterned, the principal surface of the silicon carbide substrate 11 may be masked with photoresist, for instance, and then the back surface protective layer 1e on the back surface may be selectively removed. If the back surface protective layer 1e is made of aluminum, the back surface protective layer 1e can be easily removed with a mixture of phosphoric acid, nitric acid and acetic acid. In that case, as the surface of the back surface ohmic electrode layer 1d is covered with a titanium nitride layer, which does not dissolve in that etchant, the etching process will advance selectively, and the back surface ohmic electrode layer 1d is never removed. After that, if the back surface ohmic electrode layer 1d is subjected to a surface treatment (e.g., etched with diluted hydrofluoric acid) and then a metallic electrode layer 1f is deposited on the back surface ohmic electrode layer 1d, the MOSFET 10a can be obtained.

Also, if the passivation layer 1c is dry-etched using some apparatus other than a barrel type dry etcher, then the throughput could somewhat decrease. Even so, if the back surface ohmic electrode layer 1d is arranged to make close contact with the stage of the dry etching apparatus, the back surface ohmic electrode layer can be shielded from plasma. In that case, even if there is no back surface protective layer 1e, the back surface ohmic electrode layer 1d will be hardly affected. Consequently, the semiconductor device 10a shown in FIG. 5 can be fabricated by omitting the deposition of the back surface protective layer 1e that had already been described with reference to FIG. 4(a) and by performing the process steps shown in FIGS. 4(b) and 4(c) without the back surface protective layer 1e.

Figure 6:
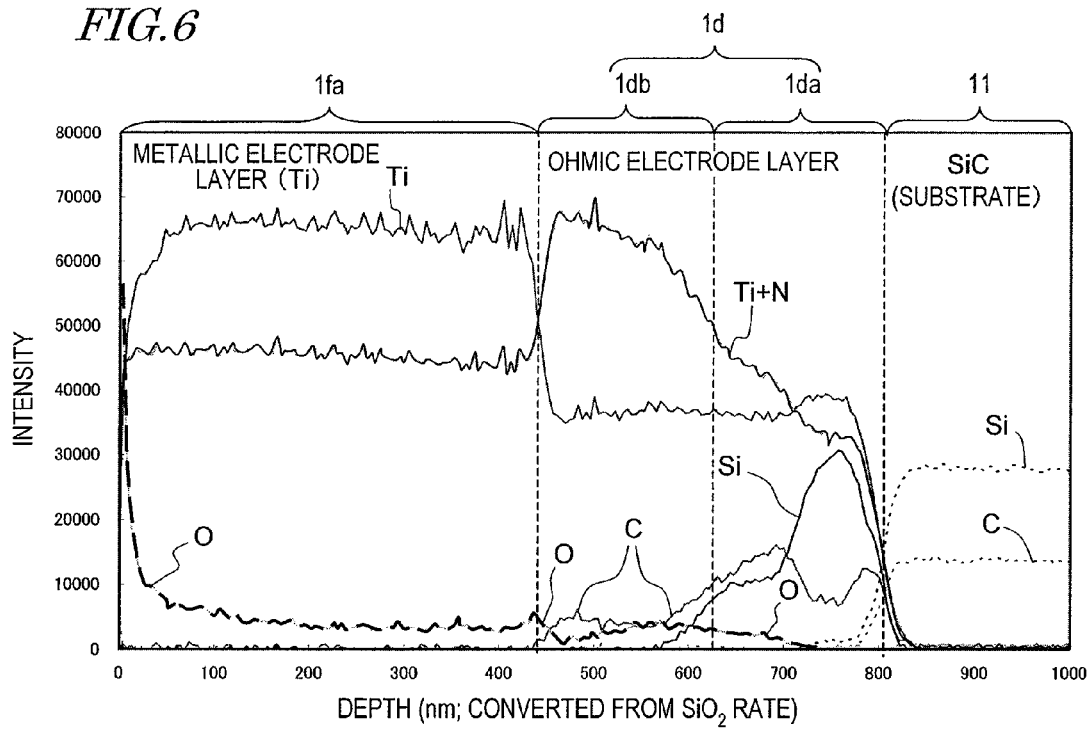
FIG. 6 shows a depth profile of the ohmic electrode layer of the semiconductor device shown in FIG. 5.

To evaluate the back surface ohmic electrode layer 1d on the back surface of the semiconductor device 10a shown in FIG. 5, a sample in which the Ni layer 1fb and the Ag layer 1fc had been removed from the metallic electrode layer 1f was prepared and subjected to an Auger electron spectroscopy. The results are shown in FIG. 6, in which the abscissa represents the depth converted from an $SiO_2$ sputter rate and the ordinate represents the Auger electron intensity of each element. In this case, the back surface ohmic electrode layer 1d was formed by depositing a titanium layer to a thickness of 150 nm on the back surface of a silicon carbide substrate and then conducting a heat treatment at 950° C. for two minutes within a nitrogen gas ambient. Also, after the heat treatment was finished, the Ti layer 1fa of the metallic electrode layer 1f was deposited to a thickness of 300 nm. In FIG. 6, the curves identified by Si, C and O represent the distributions of silicon, carbon and oxygen elements, respectively. Also, the curve identified by Ti+N represents the combined distribution of titanium and titanium bonded to nitrogen, while the curve Ti represents the distribution of titanium that had been bonded to various elements other than nitrogen. It should be noted that as the sensitivity was different from one element to another, the intensities do not represent the exact ratio of the respective elements included.

As shown in FIG. 6, there was almost no carbon in a portion of the back surface ohmic electrode layer 1d in the vicinity of the interface with the Ti layer 1*fa*. Thus, it can be seen that even if the heat treatment was carried out, no carbon had precipitated on the surface of the back surface ohmic electrode layer 1*d* (i.e., its surface not in contact with the silicon carbide substrate). Also, there was almost no oxygen in a portion of the back surface ohmic electrode layer 1*d* in the vicinity of the interface with the silicon carbide substrate 11. Therefore, it can be seen that there was no oxide film that would interfere with good ohmic contact between the silicon carbide substrate 11 and the back surface ohmic electrode layer 1*d*.

In this sample, titanium nitride was its main ingredient in a region with a depth of approximately 200 nm (when converted from an $SiO_2$ sputter rate and) when measured from the interface between the back surface ohmic electrode layer 1*d* and the metallic electrode layer 1*fa* toward the silicon carbide substrate 11. Thus, it can be seen that the titanium nitride layer 1*db* had been produced on the other side of the back surface ohmic electrode layer 1*d* that was opposite to the one side that was in contact with the back surface of the silicon carbide substrate 11. On the other hand, there were titanium, silicon and carbon in a region of the back surface ohmic electrode layer 1*d* with a depth of approximately 200 nm when measured from the back surface of the silicon carbide substrate 11 (i.e., the interface between the back surface ohmic electrode layer 1*d* and the silicon carbide substrate 11) toward the Ti layer 1*fa*. Thus, it can be seen that a reaction layer 1*da* made of an alloy of these elements had been produced there. It can also be seen that in the back surface ohmic electrode layer 1*d*, the closer to the silicon carbide substrate 11, the higher the concentration of carbon and the closer to the surface of the back surface ohmic electrode layer 1*d*, the lower the concentration of carbon.

In FIG. 6, the Ti+N curve also had certain intensity in the region of the Ti layer 1*fa*. However, the Ti+N curve in that region indicates that Ti was present in the Ti layer 1*fa* but nitrogen was absent from the Ti layer 1*fa*. As described above, according to the Auger electron spectroscopy shown in FIG. 6, the "Ti+N" curve should represent the combined distribution of titanium and titanium that was bonded to nitrogen as is required by its analysis technique. Also, it is apparent that nitrogen is absent from the Ti layer 1*fa* because the Ti layer 1*fa* was deposited on the back surface ohmic electrode layer 1*d* after the back surface ohmic electrode layer 1*d* had been thermally treated within a nitrogen gas ambient.

The present inventors measured the bond strength of the metallic electrode layer 1*f* in the MOSFET 10*a*. The results will be described shortly. The measurement was carried out in the following manner. First, twenty-five 5×5 mm squares were drawn with a diamond stylus on the surface of the metallic electrode layer 1*f* on the back surface of the MOSFET 10*a* so as to form five by five cubes. Next, an adhesive tape was attached onto the surface of those twenty-five cubes and then removed from them, thereby counting how many cubes of the metallic electrode layer 1*f* peeled off.

As a result of this test, the metallic electrode layer 1*f* peeled off linearly along only a part of the lines that had been drawn with a diamond stylus but was never transferred onto the adhesive tape and stayed on the semiconductor device 10*a* in any of those twenty-five areas. Thus, the present inventors confirmed that in the MOSFET of this preferred embodiment, the metallic electrode layer adhered to the back surface ohmic electrode with sufficient bond strength.

As described above, in the semiconductor device of this preferred embodiment, the back surface ohmic electrode layer consists of: a reaction layer that is arranged on one side in contact with the back surface of the silicon carbide substrate and that includes titanium, silicon and carbon; and a titanium nitride layer, which is arranged on the other side opposite to the one side that contacts with the back surface of the silicon carbide substrate. As Ti in the reaction layer can react to silicon and carbon, carbon can be introduced into the reaction layer without allowing carbon to liberate itself and precipitate on the surface of the ohmic electrode being formed. In addition, the titanium nitride layer is arranged on the other side out of contact with the back surface of the silicon carbide substrate to prevent carbon from diffusing toward the surface of the back surface ohmic electrode layer (i.e., the surface that is not in contact with the silicon carbide substrate). As a result, precipitation of carbon onto the surface of the back surface ohmic electrode layer and peeling of the metallic electrode layer off the surface of the back surface ohmic electrode layer can be both minimized.

In addition, titanium will get oxidized easily. That is why even if an oxide film or any other residue is slightly left on the back surface of the silicon carbide substrate, titanium will reduce that oxide film and contribute to making a good ohmic contact between the reaction layer and the silicon carbide substrate.

Furthermore, since the surface of the back surface ohmic electrode layer is covered with the titanium nitride layer, it is possible to prevent the back surface ohmic electrode layer from getting etched unintentionally while a process for forming a structure on the principal surface of the silicon carbide substrate is being carried out during the manufacturing process of the semiconductor device.

Optionally, if a protective layer is further provided on the surface of the titanium nitride layer of the back surface ohmic electrode layer, the surface of the back surface ohmic electrode layer can also be protected even while an etching process is being carried out on an insulating film on the principal surface of the silicon carbide substrate.

It should be noted that the MOSFET of this preferred embodiment does not have to have the structure shown in FIGS. 1 through 5. For example, in the MOSFET structure shown in FIGS. 1 through 5, a channel layer 16 of silicon carbide is arranged on the semiconductor layer 12. However, the channel layer 16 could be omitted. In such a structure with no channel layer 16, a portion of the p-type well region 13 in the semiconductor layer 12, which is located between the $n^+$-type source region 14 and the rest of the semiconductor layer 12 other than the p-type well region 13 and under the gate electrode 18, will be a channel region. When a voltage is applied to the gate electrode 18, an inversion layer will be formed in the channel region and a channel to make electrons move is formed.

In the preferred embodiment described above, the present invention is supposed to be implemented as a double implanted MOSFET (which is also called a "DIMOSFET"). However, the present invention is also applicable to a trench MOSFET, an IGBT or any other type of device.

Embodiment 2

Hereinafter, a second specific preferred embodiment of a semiconductor device according to the present invention will be described. In the following description of the second preferred embodiment, the semiconductor device is supposed to be a vertical Schottky diode.

Figure 7:
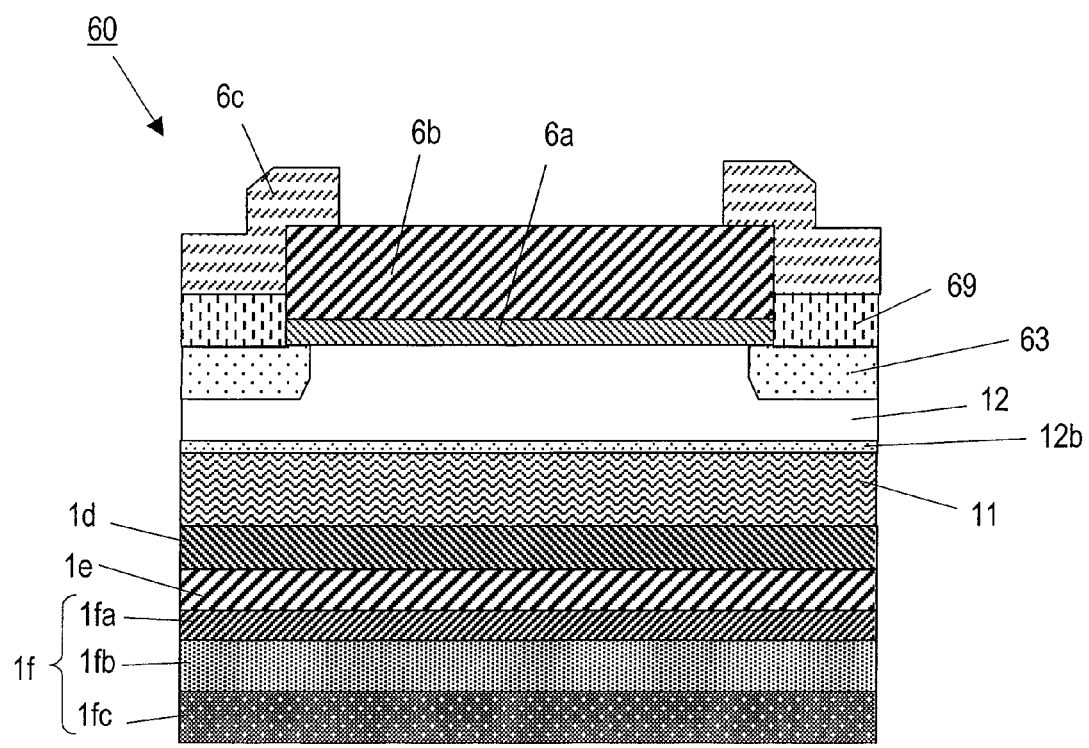
FIG. 7 is a cross-sectional view illustrating a second preferred embodiment of a semiconductor device according to the present invention.

FIG. 7 is a cross-sectional view illustrating a Schottky diode 60 as a second specific preferred embodiment of a semiconductor device according to the present invention. The Schottky diode 60 includes a silicon carbide substrate 11, of which the principal surface defines a tilt angle of θ degrees (where 0≦θ≦10 degrees) with respect to a 4H—SiC (0001) plane in the <11-20> direction. The principal surface of the silicon carbide substrate 11 is a Si surface, while its back surface is a C-plane. The surface roughness of the principal surface is less than that of the back surface. The silicon carbide substrate 11 has a dopant concentration of $1\times10^{18}$ cm$^{-3}$ or more. A semiconductor layer 12 of n-type 4H—SiC (with a dopant concentration of approximately $1\times10^{14}$ to $1\times10^{17}$ cm$^{-3}$ and a thickness of 5 μm or more) has been epitaxially grown on the principal surface of the silicon carbide substrate 11. Optionally, a buffer layer 12b could be inserted between the semiconductor layer 12 and the silicon carbide substrate 11.

A girdling region 63 is defined in the vicinity of the surface of the semiconductor layer 12 to lessen the excessive concentration of electric field. The girdling region 63 may be defined by implanting aluminum ions into the semiconductor layer 12 and may have a depth of approximately 600 nm and an average concentration of approximately $1\times10^{18}$ cm$^{-3}$.

On the surface of the semiconductor layer 12, arranged is a Schottky electrode layer 6a, which is made of a metal (such as Ti, Ni, Mo or W) that can make Schottky contact with the semiconductor layer 12 and may have a thickness of approximately 50-200 nm. The end of the Schottky electrode layer 6a is in contact with the girdling region 63. And on the Schottky electrode layer 6a, arranged is an upper interconnect electrode layer 6b, which may be made of aluminum and may have a thickness of approximately 3 μm, for example.

An insulating layer 69 of SiO$_2$, for example, has been formed so as to cover the girdling region 63. This insulating layer 69 may be an oxide layer obtained by oxidizing the semiconductor layer 12. Furthermore, a passivation layer 6c is arranged so as to cover the end of the upper interconnect electrode layer 6b. Optionally, the passivation layer 6c and the insulating layer 69 may form a single layer.

On the back surface of the silicon carbide substrate 11, arranged is a back surface ohmic electrode layer 1d, which has the same structure as the counterpart of the first preferred embodiment described above. Specifically, as shown in FIG. 1(b), the back surface ohmic electrode layer 1d consists of a reaction layer 1da and a titanium nitride layer 1db. The reaction layer 1da is arranged on one side in contact with the back surface of the silicon carbide substrate 11 and includes titanium, silicon and carbon. On the other hand, the titanium nitride layer 1db is arranged on the other side opposite to the one side that contacts with the back surface of the silicon carbide substrate and on the surface of the reaction layer 1da and is made mostly of titanium nitride.

The titanium nitride layer 1db also includes carbon. But looking at the back surface ohmic electrode layer 1d as a whole, the concentration of carbon is higher in the region closer to the silicon carbide substrate 11 than in the region more distant from the back surface of the silicon carbide substrate 11. Preferred thicknesses of the reaction layer 1da and the titanium nitride layer 1db are just as already described for the first preferred embodiment.

On the other side of the back surface ohmic electrode layer 1d, which is opposite to the one side that contacts with the back surface of the silicon carbide substrate 11, arranged is a back surface protective layer 1e, which is resistant to an etching process being performed on a passivation layer 1c, for example, and has electrical conductivity. For example, if the passivation layer 1c is made of SiN, then the back surface protective layer 1e may be made of aluminum as in the first preferred embodiment described above.

On the other side of the back surface protective layer 1e, which is opposite to the one side that contacts with the back surface ohmic electrode layer 1d, arranged is a metallic electrode layer 1f. In the example illustrated in FIG. 7, the metallic electrode layer 1f consists of three layers. However, the metallic electrode layer 1f may also consist of a single layer or may include multiple layers. For example, the metallic electrode layer 1f may include a Ti layer 1fa, a Ni layer 1fb, and an Ag layer 1fc. In that case, the Ti layer 1fa contacts with the back surface protective layer 1e. If the Schottky diode 60 needs to be housed in a package such as TO-220, then the Schottky diode 60 should be soldered with the leadframe of the package. For that reason, it is preferred that the Schottky diode 60 include the metallic electrode layer 1f.

Figure 8:
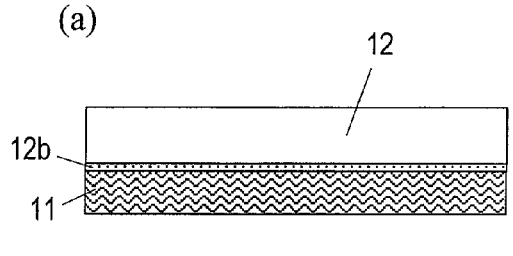
FIGS. 8(*a*) through 8(*f*) are cross-sectional views illustrating respective process steps to fabricate the semiconductor device shown in FIG. 7.
Figure 8:
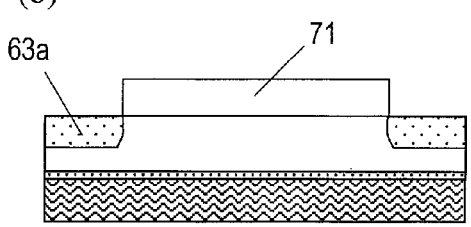
Figure 8:
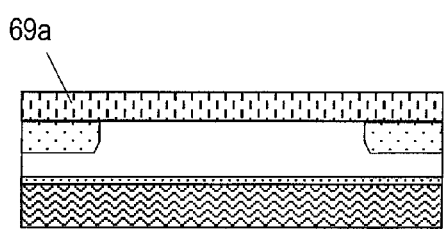
Figure 8:
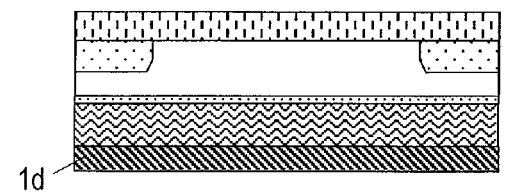
Figure 8:
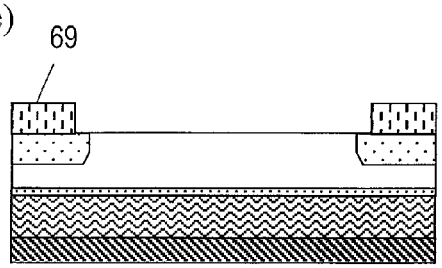
Figure 8:
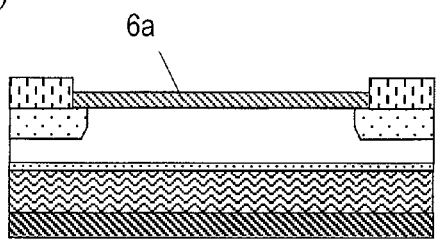

Hereinafter, it will be described with reference to FIGS. 8 and 9 how to fabricate this semiconductor device 60.

First, as shown in FIG. 8(a), a silicon carbide substrate 11, of which the principal surface has been covered with a semiconductor layer 12, is provided. Optionally, a buffer layer may be inserted between the semiconductor layer 12 and the principal surface of the silicon carbide substrate 11. In that case, the buffer layer is made of n$^+$-type semiconductor (i.e., silicon carbide in this example), and has a thickness of approximately 0.5 to 4 μm and a dopant concentration of approximately $1\times10^{16}$ to $1\times10^{19}$ cm$^{-3}$. In this example, the semiconductor layer 12 is made of 4H—SiC. Next, as shown in FIG. 8(b), the surface of the semiconductor layer 12 is selectively covered with a mask 71 and then aluminum or boron ions are implanted as a dopant, thereby defining a p-type girdling region 63a. After that, the mask 71 is removed.

Next, a carbon based thin film is deposited on the surface of the silicon carbide substrate 11 and heated to approximately 1,700° C. for about 30 minutes within an inert atmosphere, thereby activating the dopants. And then the carbon based thin film is removed to activate the girdling region 63a.

Subsequently, as shown in FIG. 8(c), an insulating layer 69a is formed on the semiconductor layer 12 with the girdling region 63. This insulating layer 69a may be a thermal oxide film to be formed when the semiconductor layer 12 is exposed to an oxygen gas ambient at approximately 1,200° C.

Thereafter, an electrode layer including titanium is deposited on the back surface of the silicon carbide substrate 11 and then a heat treatment is carried out at a temperature of approximately 800-1,100° C. within a nitrogen gas ambient. In this manner, a back surface ohmic electrode layer 1d, of which the surface has been nitrified, can be obtained as shown in FIG. 8(d).

Next, as shown in FIG. 8(e), the insulating layer 69a on the principal surface of the silicon carbide substrate 11 is partially etched, thereby exposing the surface of the semiconductor layer 12 and a part of the girdling region 63. Thereafter, a Schottky electrode layer 6a is deposited (e.g., Ti is deposited to a thickness of approximately 100 nm) over the exposed portions to obtain the structure shown in FIG. 8(f). The Schottky electrode layer 6a may be deposited by evaporating Ti over the entire principal surface in the state shown in FIG. 8(e), patterning the Ti film using photoresist and then etching away excessive portions. Alternatively, after the insulating layer 69a has been patterned using a photoresist mask in the process step shown in FIG. 8(d) so that only necessary portions are left, the photoresist mask may be left intentionally, Ti may be evaporated as it is through the mask, and then a lift-off process may be carried out to obtain the structure shown in FIG. 8(f).

Thereafter, a metal (such as aluminum) to be an upper interconnect electrode is deposited and then patterned, thereby forming an upper interconnect electrode layer 6b and obtaining the structure shown in FIG. 9(a). If the upper interconnect electrode layer 6b is made of aluminum and has been patterned by performing a wet etching process using a phosphoric acid based etchant, then the back surface ohmic electrode layer 1d on the back surface will be hardly etched because its surface is the titanium nitride layer.

If the patterning process is performed as a dry etching process, a metal such as Cu, Au or Pt is preferably deposited on the back surface ohmic electrode layer 1d to prevent the back surface ohmic electrode layer 1d from getting corroded. In that case, that metal can be used as it is as the back surface protective layer 1e in a subsequent process step.

Next, as shown in FIG. 9(b), a back surface protective layer 1e is deposited on the back surface ohmic electrode layer 1d. The back surface protective layer 1e preferably has electrical conductivity. As already described for the first preferred embodiment, precipitation of carbon on the surface of the back surface ohmic electrode layer 1d can also be reduced in this preferred embodiment. As a result, the back surface protective layer 1e can make a good contact with the back surface ohmic electrode layer 1d and peeling of the back surface protective layer 1e off the back surface ohmic electrode layer 1d can be minimized.

Thereafter, a passivation layer 6c is deposited over that side with the upper interconnect electrode 6b and then selectively etched so that the upper interconnect electrode 6b has its surface exposed with its periphery masked. In this case, if an SiN film is used as the passivation layer 6c, then the passivation layer 6c is preferably dry-etched. As a silicon carbide substrate has a smaller diameter than a silicon substrate and as silicon carbide substrates with a diameter of three inches are currently used extensively, a barrel type dry etcher is particularly preferred to increase the throughput. With such a barrel type dry etcher, however, both the principal surface and the back surface of the silicon carbide substrate would be exposed to plasma. For that reason, without the back surface protective layer 1e, the back surface ohmic electrode layer 1d would be directly exposed to plasma and could be partially etched according to the kind of the gas used.

The Schottky diode 60 of this preferred embodiment includes the back surface protective layer 1e of aluminum. The back surface protective layer 1e is resistant to the dry etching process being performed on the passivation layer 6c on the principal surface, and therefore, can protect the back surface ohmic electrode layer 1d while the passivation layer 6c is being dry-etched. On top of that, the back surface protective layer 1e is hardly etched, either. As a result of this dry etching process, a structure that has the passivation layer 6c on its surface can be obtained as shown in FIG. 9(c).

If polyimide is used as a material for the passivation layer 6c, then the material of the back surface protective layer 1e may be selected from the group consisting of aluminum, Cu, Au, Ag and Pt.

Figure 9:
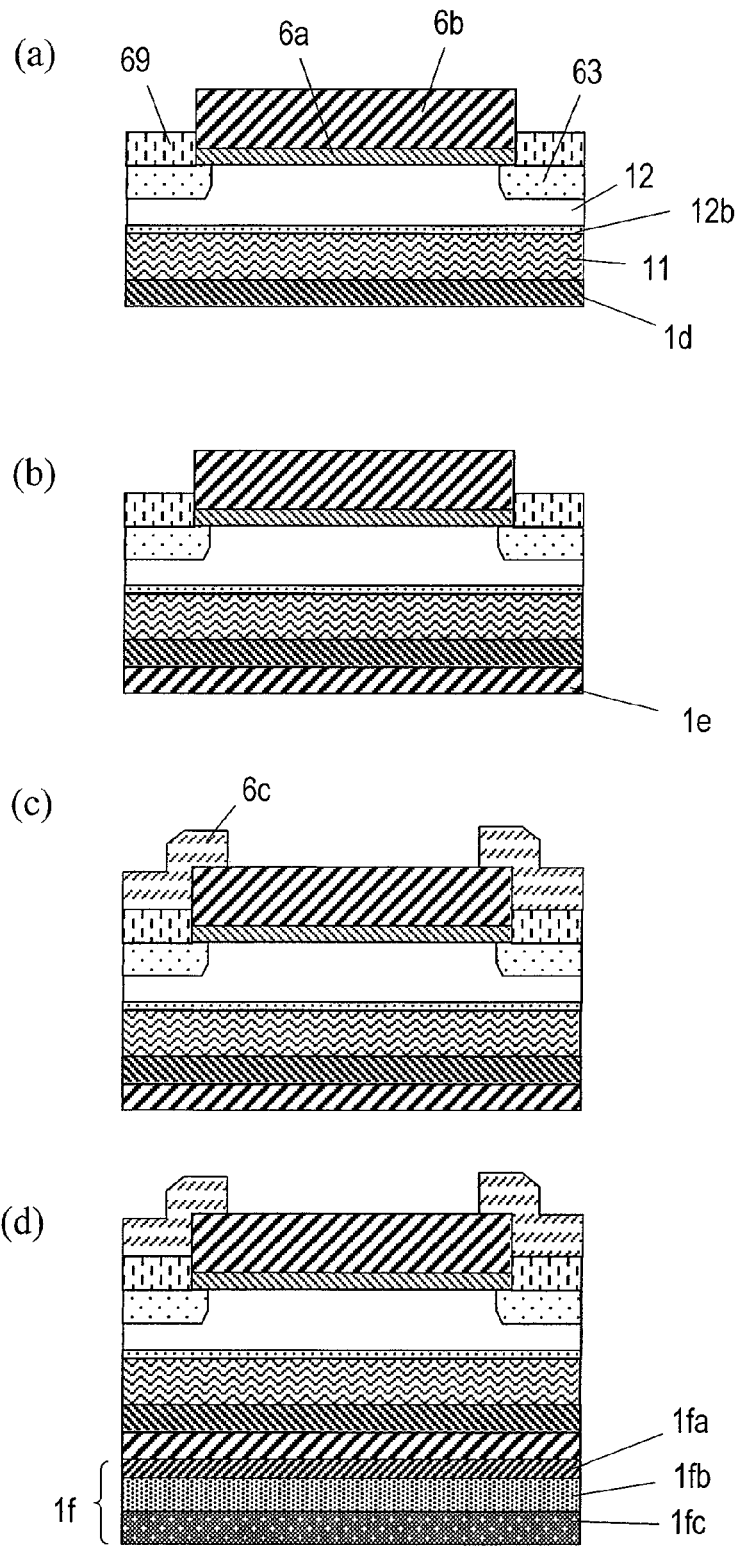
FIGS. 9(*a*) through 9(*d*) are cross-sectional views illustrating respective process steps to fabricate the semiconductor device.

Finally, the uppermost surface layer of the back surface protective layer 1e shown in FIG. 9(d) is slightly etched (e.g., wet-etched with diluted hydrofluoric acid) and a metallic electrode layer 1f is deposited on the back surface protective layer 1e to complete the Schottky diode 60. As shown in FIG. 9(d), the metallic electrode layer 1f includes a Ti layer 1fa, an Ni layer 1fb and an Ag layer 1fc. However, the multilayer structure of the metallic electrode layer 1f does not have to be what is shown in FIG. 9 but could be appropriately determined by the package shape of the Schottky diode 60. Specifically, the metallic electrode layer 1f may consist of either Ti/Ni/Au layers or Cr/NiCr/Ni/Ag layers or could be any other combination of metals.

In the preferred embodiment described above, the metallic electrode layer 1f is supposed to be deposited with the back surface protective layer 1e left almost as it is. However, the Schottky diode of the present invention could have no back surface protective layer 1e, too. That is to say, the present invention could also be implemented as a Schottky diode 60a with no back surface protective layer 1e as shown in FIG. 10.

Figure 10:
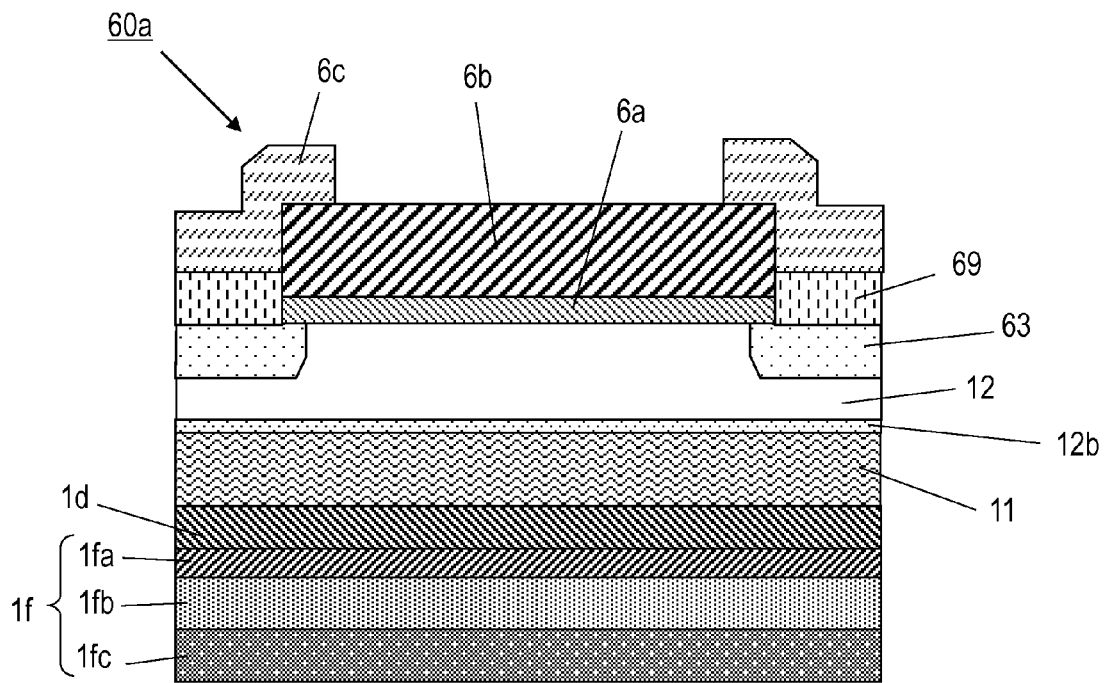
FIG. 10 is a cross-sectional view illustrating a modified example of the second preferred embodiment.
Figure 11:
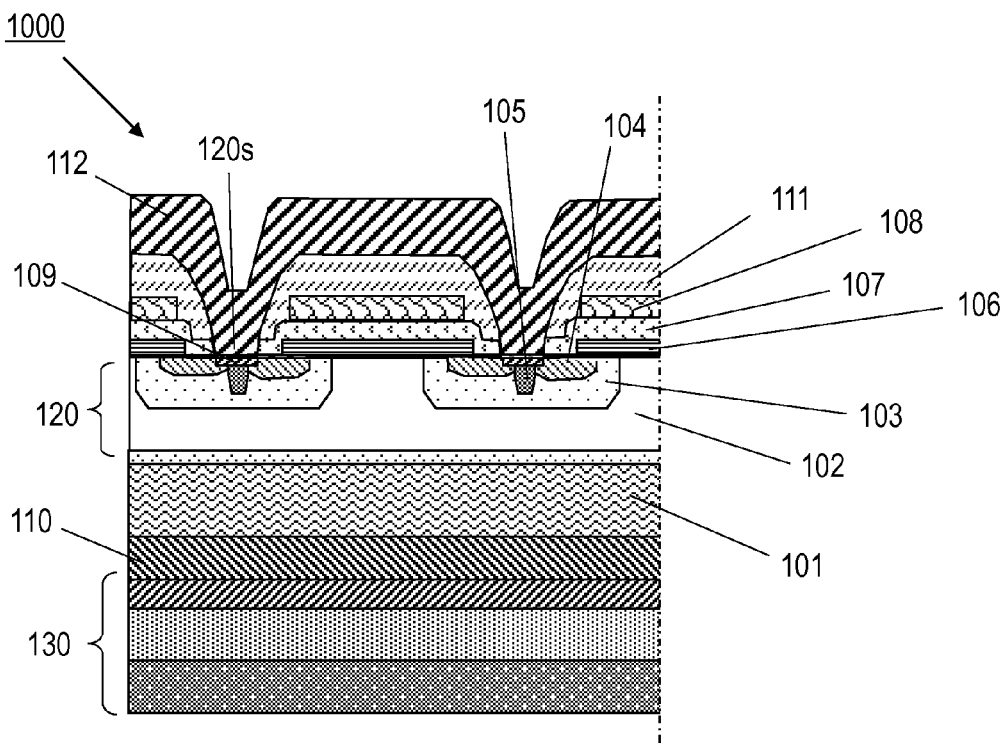
FIG. 11 is a cross-sectional view illustrating a conventional semiconductor device.

The Schottky diode 60a shown in FIG. 10 has a structure which includes no back surface protective layer 1e and in which the metallic electrode layer 1f is arranged directly on the other side of the back surface ohmic electrode layer 1d that is opposite to its surface in contact with the back surface of the silicon carbide substrate 11.

Such a Schottky diode 60a can be obtained by removing the back surface protective layer 1e while the Schottky diode 60 described above is being fabricated.

For example, during the manufacturing process of the Schottky diode 60 described above, the passivation layer 6c shown in FIG. 9(c) may be etched and patterned, the principal surface of the silicon carbide substrate 11 may be masked with photoresist, for instance, and then the back surface protective layer 1e on the back surface may be selectively removed. If the back surface protective layer 1e is made of aluminum, the back surface protective layer 1e can be easily removed with a mixture of phosphoric acid, nitric acid and acetic acid. In that case, as the surface of the back surface ohmic electrode layer 1d is covered with a titanium nitride layer, which does not dissolve in that etchant, the etching process will advance selectively, and the back surface ohmic electrode layer 1d is never removed. After that, if the back surface ohmic electrode layer 1d is subjected to a surface treatment (e.g., etched with diluted hydrofluoric acid) and then a metallic electrode layer 1f is deposited on the back surface ohmic electrode layer 1d, the Schottky diode 60a can be obtained.

Also, if the passivation layer 6c is dry-etched using some apparatus other than a barrel type dry etcher, then the throughput could somewhat decrease. Even so, if the back surface ohmic electrode layer 1d is arranged to make close contact with the stage of the dry etching apparatus, the back surface ohmic electrode layer can be shielded from plasma. In that case, even if there is no back surface protective layer 1e, the back surface ohmic electrode layer 1d will be hardly affected. Consequently, the Schottky diode 60a shown in FIG. 10 can be fabricated by omitting the deposition of the back surface protective layer 1e that had already been described with reference to FIG. 9(b) and by performing the process steps shown in FIGS. 9(c) and 9(d) without the back surface protective layer 1e.

In the preferred embodiment described above, the present invention is supposed to be implemented as a Schottky diode. However, the present invention may also be implemented as a pn junction diode or any other type of device.

Also, in the foregoing description of preferred embodiments of the present invention, a 4H—SiC substrate is supposed to be used as the silicon carbide substrate 11. However, the SiC substrate may use any other crystallographic plane as its principal surface and may be of any other poly-type. Also, its off-axis angle may also be defined in the <1-100> direction, for example, instead of the <11-20> direction.

Particularly, if the surface (i.e., the principal surface) of the silicon carbide substrate 11 is an Si surface and its back surface is a C-plane and if the back surface has greater surface roughness than the principal surface, the area of contact of the ohmic electrode with the back surface will be greater than on the Si surface. That is why the back surface ohmic electrode layer 1d with low contact resistance can be formed more easily over the entire back surface.

The effect of the present invention can be achieved sufficiently as long as the silicon carbide substrate has a principal surface that defines a tilt angle of θ degrees (where 0<θ≦10 degrees) with respect to a (0001) plane. However, the effect of the present invention can also be achieved even if the principal surface is exactly a (0001) plane or any other crystallographic plane (such as a (1-100) plane, a (11-20) plane or a (03-38) plane).

Furthermore, in the preferred embodiments described above, the principal surface of the silicon carbide substrate is supposed to be an Si surface and its back surface is supposed to be a C-plane. Alternatively, the back surface may also be an Si surface and the principal surface may be a C-plane. In that case, however, the back surface preferably has greater surface roughness than the principal surface.

Furthermore, in the preferred embodiments described above, the back surface protective layer is supposed to be made of aluminum. However, the back surface protective layer may also be made of any other suitable material (such as Cu, Ag, Au or Pt) as long as the material has some resistance to the etching process being performed on the passivation layer on the principal surface.

Also, in the preferred embodiments described above, the back surface protective layer is supposed to be a single layer. However, the back surface protective layer may naturally be made up of multiple layers. In that case, a material that has some resistance to the etching process being performed on the passivation layer on the principal surface is preferably deposited to form a layer that is more distant from the back surface ohmic electrode layer.

INDUSTRIAL APPLICABILITY

According to the present invention, the back surface ohmic electrode layer includes a reaction layer that has been produced as a result of reaction between titanium and silicon, and the opposite side of the back surface ohmic electrode layer, which is not in contact with the silicon carbide substrate, is titanium nitride. That is why even when an electrode patterning process or any other process is carried out on the principal surface, the back surface ohmic electrode will be hardly etched. In addition, by providing a back surface protective layer, which is resistant to an etching process being performed on an insulating layer on the principal surface (i.e., the passivation layer), on the back surface ohmic electrode layer, a good ohmic contact property is realized without doing no direct damage on the back surface ohmic electrode layer. Consequently, the present invention is applicable to an MOSFET, an IGBT, a Schottky diode, a pn diode or any other semiconductor device that has an ohmic electrode on the back surface of a silicon carbide substrate.

The invention claimed is:

1. A semiconductor device comprising:
a silicon carbide substrate that has a principal surface and a back surface;
a silicon carbide layer, which has been formed on the principal surface of the silicon carbide substrate; and
an ohmic electrode layer, which has been formed on the back surface of the silicon carbide substrate,
wherein the ohmic electrode layer includes: a reaction layer, which is arranged in contact with the back surface of the silicon carbide substrate and which includes titanium, silicon and carbon; and a titanium nitride layer, which has been formed on a surface of the reaction layer that is opposite to the surface of the reaction layer that contacts with the back surface of the silicon carbide substrate, and
wherein the concentration of carbon in the ohmic electrode layer is higher in a region closer to the back surface of the silicon carbide substrate than in a region more distant from the back surface of the silicon carbide substrate.

2. The semiconductor device of claim 1, further comprising:
an insulating layer, which at least partially covers the silicon carbide layer either directly or indirectly; and
a protective layer, which has been formed on the surface of the titanium nitride layer of the ohmic electrode layer,
wherein the protective layer is resistant to an etching process of the insulating layer.

3. The semiconductor device of claim 2, further comprising a metallic electrode layer, which is arranged on the surface of the protective layer,
wherein the protective layer has electrical conductivity.

4. The semiconductor device of claim 1, further comprising a metallic electrode layer, which has been formed on the surface of the titanium nitride layer of the ohmic electrode layer.

5. The semiconductor device of claim 1, wherein the silicon carbide layer has n-type conduction.

6. The semiconductor device of claim 5, further comprising:
a p-type well region, which is defined in the silicon carbide layer;
an $n^+$-type source region and a $p^+$-type contact region, which form respective parts of the p-type well region;
a channel region, which is electrically connected to the $n^+$-type source region and to the rest of the silicon carbide layer other than the p-type well region;
a source electrode, which is electrically connected to the $n^+$-type source region and the $p^+$-type contact region;
a gate insulating film, which is arranged on the channel region; and
a gate electrode, which is arranged on the gate insulating film,
wherein the ohmic electrode layer functions as a drain electrode.

7. The semiconductor device of claim 5, further comprising a Schottky electrode that makes Schottky contact with the silicon carbide layer.

8. A method for fabricating a semiconductor device, the method comprising the steps of:
(A) providing a silicon carbide substrate, the principal surface of which is already covered with a silicon carbide layer;
(B) forming an electrode layer, including titanium, on the back surface of the silicon carbide substrate; and
(C) conducting a heat treatment on the silicon carbide substrate within an atmosphere including nitrogen and producing a reaction between the electrode layer and the silicon carbide substrate to form simultaneously a reaction layer, including titanium, silicon and carbon, on the back surface of the silicon carbide substrate; and a titanium nitride layer on the surface of the reaction layer, wherein the concentration of carbon is higher in a region of the reaction layer closer to a side of the reaction layer which contacts with the back surface of the silicon carbide substrate than in a region of the titanium nitride layer closer to a side of the titanium nitride layer opposite to the back surface of the silicon carbide substrate.

9. The method of claim 8, further comprising the steps of:

(D) forming an insulating layer, which at least partially covers the silicon carbide layer either directly or indirectly, after the step (C) has been performed;

(E) forming a protective layer on the ohmic electrode layer; and (F) etching the insulating layer after the step (E) has been performed.

10. The method of claim 9, further comprising the step (G) of removing the protective layer after the step (F) has been performed.

* * * * *

UNITED STATES PATENT AND TRADEMARK OFFICE
CERTIFICATE OF CORRECTION

| | |
|---|---|
| PATENT NO. | : 8,237,172 B2 |
| APPLICATION NO. | : 12/676415 |
| DATED | : August 7, 2012 |
| INVENTOR(S) | : Uchida et al. |

It is certified that error appears in the above-identified patent and that said Letters Patent is hereby corrected as shown below:

In the Specification

Column 6, line 34, "with gate electrode" should be -- with gate electrode 18 --; and Column 6, line 36, "18" should be deleted.

Signed and Sealed this
Eighteenth Day of March, 2014

Michelle K. Lee
*Deputy Director of the United States Patent and Trademark Office*